United States Patent [19]

Cline

[11] Patent Number: 4,461,070
[45] Date of Patent: Jul. 24, 1984

[54] METHOD FOR MAKING EUTECTIC CHARGE-COUPLED DEVICES

[75] Inventor: Harvey E. Cline, Schenectady, N.Y.

[73] Assignee: General Electric Company, Schenectady, N.Y.

[21] Appl. No.: 382,878

[22] Filed: May 28, 1982

[51] Int. Cl.³ .............................................. H01L 27/10
[52] U.S. Cl. ........................................ 29/571; 29/579; 29/576 B; 148/1.5; 148/174; 428/611; 357/24
[58] Field of Search ................... 29/571, 579, 576 B; 357/24; 148/1.5, 187, 174; 428/611

[56] References Cited

U.S. PATENT DOCUMENTS

| | | | |
|---|---|---|---|
| 2,983,633 | 5/1961 | Bernardi et al. | 29/579 |
| 3,387,360 | 6/1968 | Nakamura et al. | 29/579 |
| 3,671,102 | 6/1972 | Clawson et al. | 428/611 X |
| 4,290,187 | 9/1981 | Stein | 29/576 B |

OTHER PUBLICATIONS

Cline, "Directionally Solidified Thin-Film Eutectic Alloys", J. Appl. Phys., 52(1), Jan. 1981, pp. 256–260.

Primary Examiner—Aaron Weisstuch
Assistant Examiner—David A. Hey
Attorney, Agent, or Firm—Paul E. Rochford; James C. Davis, Jr.; James Magee, Jr.

[57] ABSTRACT

A method is described for the fabrication of charge-coupled devices by the formation of a thin film lamellar metallic eutectic and subsequent selective removal of one of the eutectic phases to form one of the spaced gate arrays of such devices.

15 Claims, 12 Drawing Figures

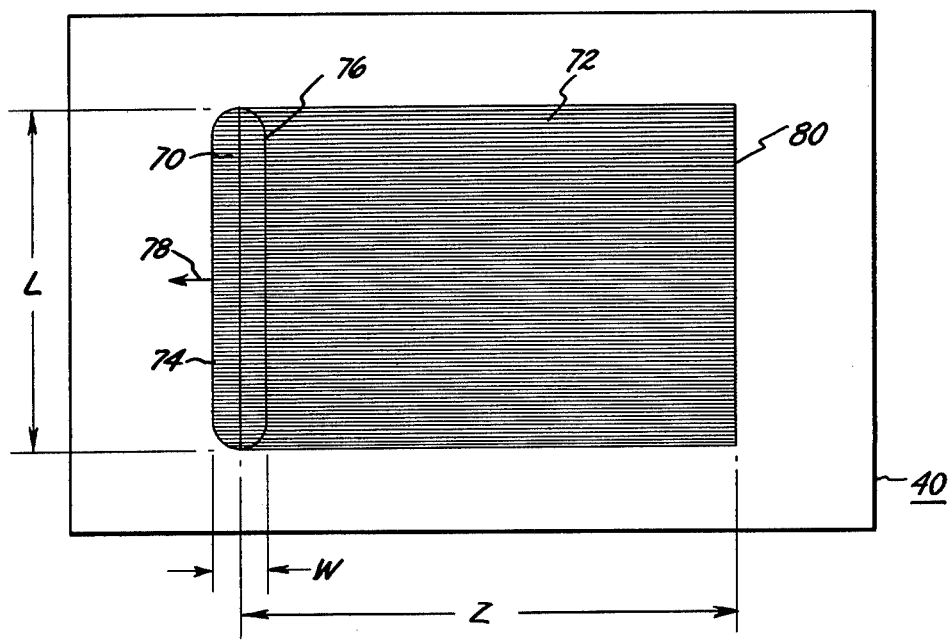
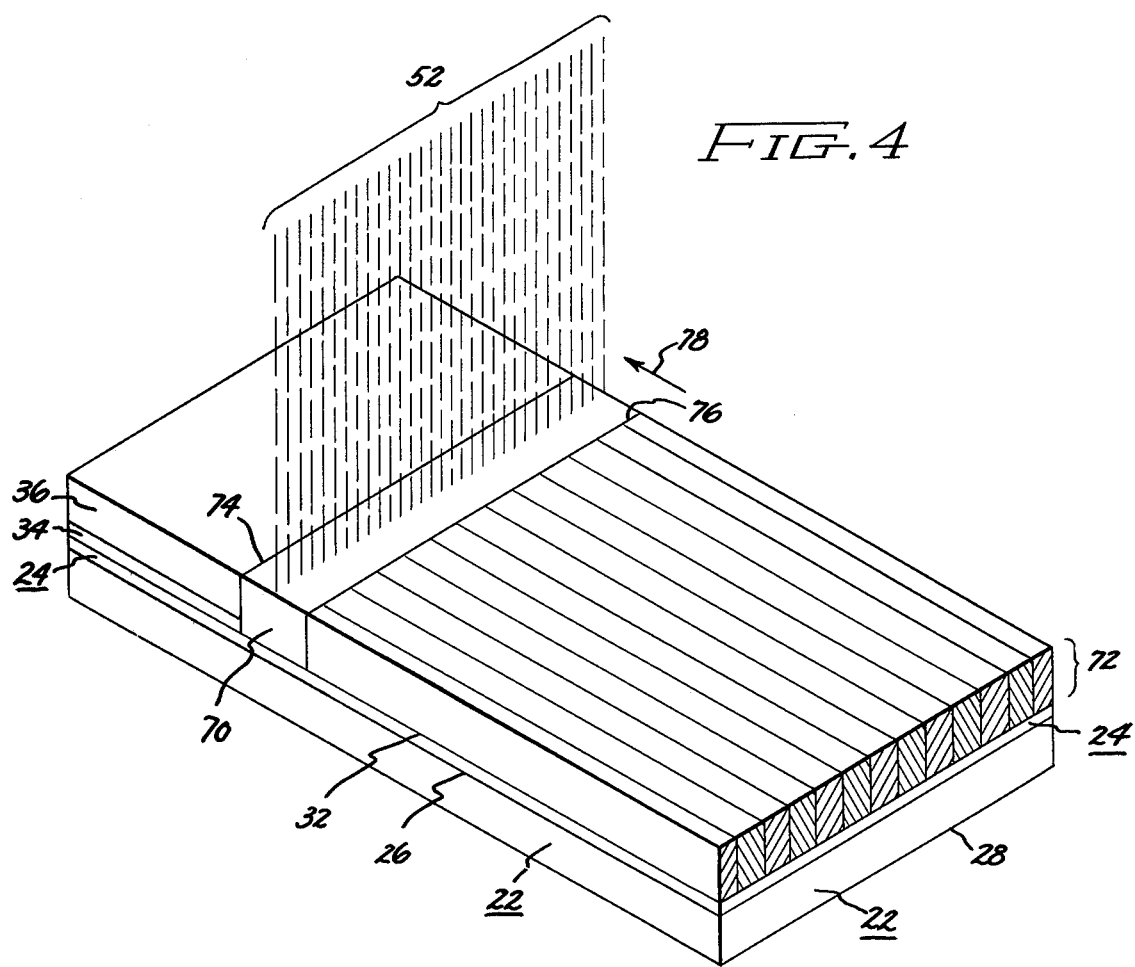

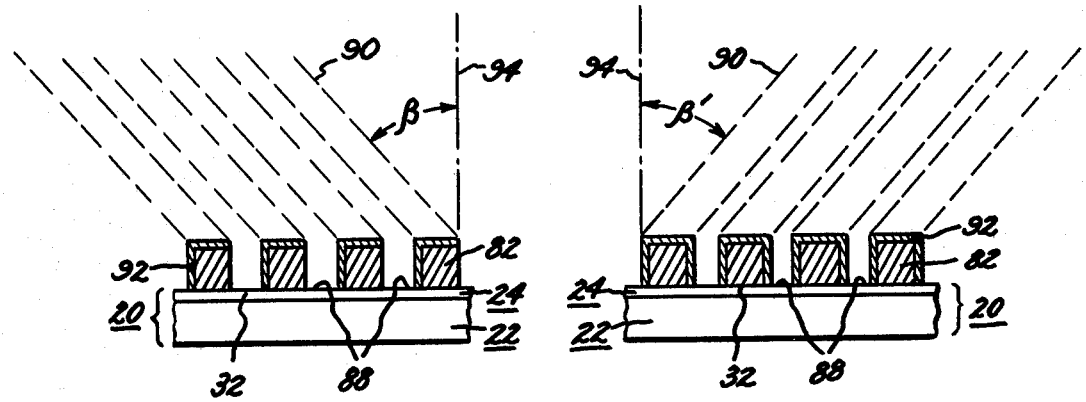
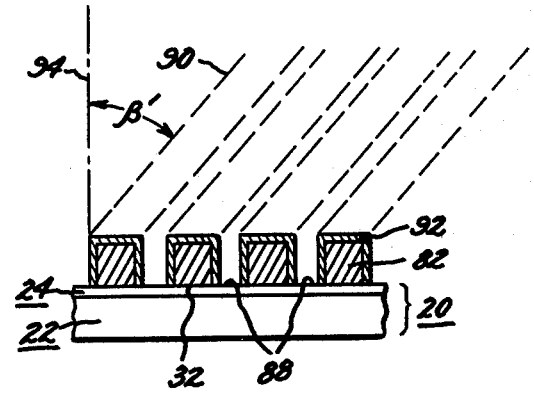
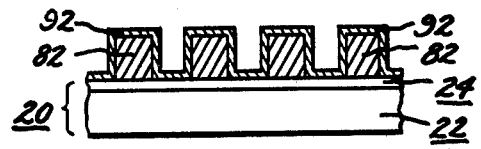
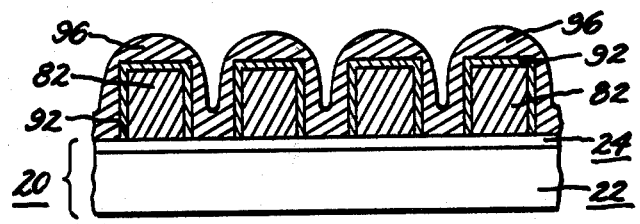
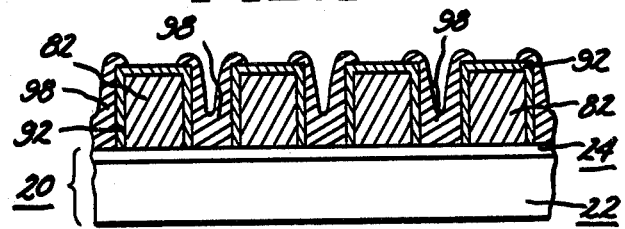

METHOD FOR MAKING EUTECTIC CHARGE-COUPLED DEVICES

CROSS-REFERENCE TO RELATED APPLICATIONS

The invention herein is related to the inventions disclosed and claimed in U.S. patent application Ser. Nos. 245,764, 253,985, and 320,995 which were filed Mar. 20, 1981, Apr. 13, 1981, and Nov. 13, 1981, respectively; all of which were filed in the name of the inventor of the invention herein, are assigned to the same assignee as the instant invention, and are herein incorporated by reference.

INTRODUCTION

This invention relates generally to charge-coupled devices and, more particularly, to charge-coupled devices made by the method of the invention wherein one of the spaced gate arrays is formed by the selective removal of one of the phases of a lamellar metallic eutectic solidified as a thin film.

BACKGROUND OF THE INVENTION

Charge coupling refers to the process of transferring an electric charge (charge packet) between adjacent storage areas (potential wells) in a semiconductor material beneath adjacent electrodes (gates) by the sequenced application of external voltages to the gates.

Devices utilizing the charge coupling concept enable a charge packet created at an input portion of the device to be moved along a trough (channel) of adjacent potential wells to the output end of the device for conversion to a voltage that can be used by other circuits. In simple charge-coupled devices (CCDs) a row of spaced mutually parallel electrodes are placed in a close or overlapping, but electrically isolated, relationship on a thin insulating layer on the surface of a semiconductor crystal. Typically, the electrodes are metal or polysilicon, the semiconductor is silicon, and the insulating layer and the insulation between electrodes is silicon dioxide. If the semiconductor crystal is p-type, as is the usual case, the charge packet will consist of minority carriers (electrons).

The charge packet may be produced, for example, by injection by means of an input diode or by the photoelectric effect to form charge packets proportional to the light intensity to produce solid state imagers. Other applications for CCDs besides imagers include signal processors, digital memories and logic arrays.

Various improvements have been made to the above-described simple CCD in order to improve such CCD characteristics as speed, frequency response and, in the case of optical devices, resolution. One such improvement, wherein highly doped zones are provided beneath the second phase gates in a two-phase CCD structure to increase the quantity of charge which may be transferred between potential wells, is described by Stein in U.S. Pat. No. 4,290,187 which is herein incorporated by reference.

Generally, the device characteristics and charge coupling efficiency increase as gate width and the spacing between gates decrease. The use of metallic gates, as opposed to polysilicon gates, is also desirable for improved characteristics. Presently, high resolution CCDs having narrow, closely spaced gates are principally produced by means of the slow and costly electron-beam lithographic processes. Other techniques, such as photolithography, are more rapid but do not produce CCDs having as narrow and closely spaced gates as CCDs produced by electron-beam processes. Further adding to the time for manufacture and cost per device are the alignment steps required by most presently used lithographic processes.

SUMMARY OF THE INVENTION

In accordance with the method of the present invention, it is possible to avoid in large measure the aforementioned drawbacks of the lithographic processes in the manufacture of charge-coupled devices. More particularly, the present invention inexpensively provides highly desirable metallic gates having micron and submicron width and spacing heretofore only attainable by means of slow and expensive electron-beam lithographic processes and the like. The metallic gates are self-aligning, thus the expensive and time consuming alignment steps of conventional lithographic processes are eliminated.

Briefly, the method of the invention includes the steps of providing a substrate suitable for the manufacture of charge-coupled devices, forming a thin film lamellar metallic eutectic on the substrate, selectively removing one of the phases of the thin film lamellar metallic eutectic to form a first array of spaced metallic wires or gates of the remaining phase, applying a layer of an insulating material over at least the exposed surfaces of the spaced metallic gates of the first array, depositing a substantially continuous layer of a conducting material over the insulated spaced metallic gates of the first array and into the spaces between the insulated spaced metallic gates, and preferentially removing segments of the deposited conducting material to form a second array of spaced metallic gates substantially juxtaposed from said metallic gates of said first array.

BRIEF DESCRIPTION OF THE DRAWINGS

FIG. 3 is a schematic representation of the top surface of the preform of FIG. 1 partially converted to a thin film lamellar eutectic;

FIG. 4 is a dimensional view of the preform of FIG. 1 undergoing processing to form a thin film lamellar eutectic;

FIGS. 8A and 8B show schematically the deposition of an insulating material at opposing oblique angles to apply a layer of the insulating material over the exposed surfaces of the spaced metallic gates of the first array while maintaining the surface of the substrate between the spaced metallic gates substantially free of the insulating material;

FIG. 8C shows schematically a portion of a first array of spaced metallic gates having a continuous layer of an insulating material over the gates and over the surface of the substrate between the spaced metallic gates;

FIG. 9 shows schematically the structure of FIG. 8B following deposition of a substantially continuous layer of a conducting material over the insulated spaced metallic gates of the first array, into the spaces between the insulated gates and onto the surface of the substrate between the insulated gates; and FIG. 10 shows schematically the structure of FIG. 9 following preferential removal of segments of the continuous layer of conducting material to form a second array of spaced metallic gates substantially juxtaposed from the metallic gates of the first array.

DETAILED DESCRIPTION OF THE INVENTION

Figure 1:
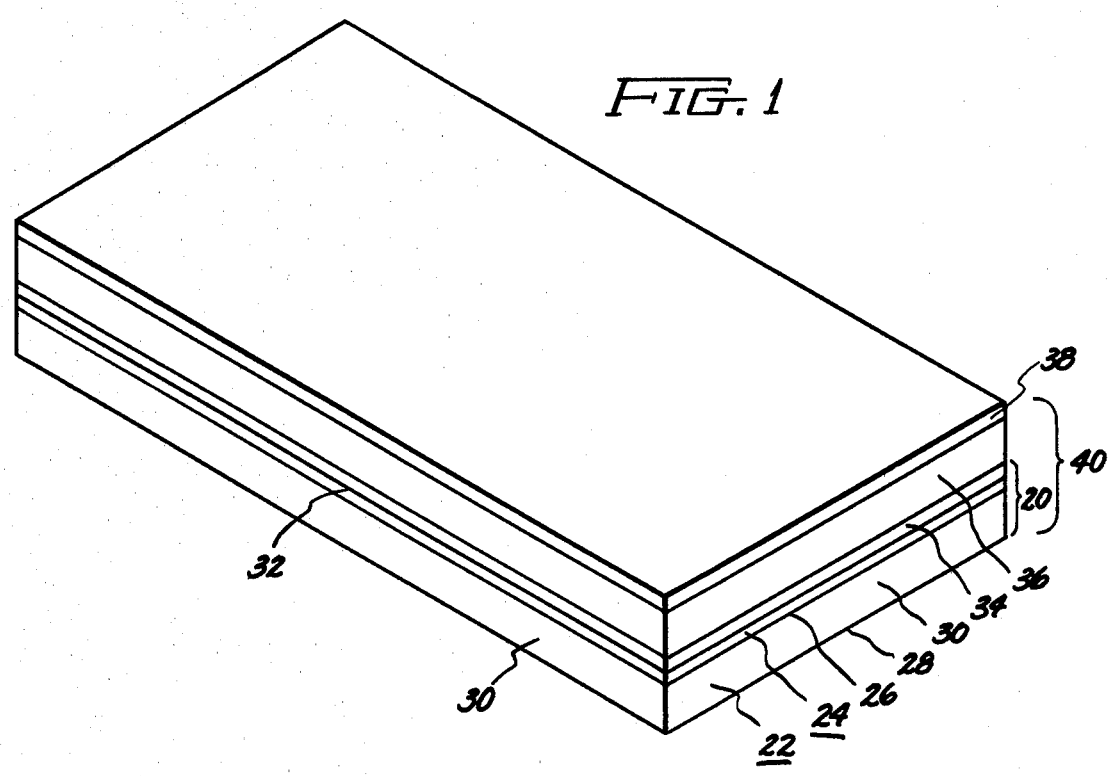
FIG. 1 is a schematic dimensional representation of a preform consisting of a substrate of a planar base plus a planar layer of a dielectric and insulating material situated on and contiguous with the top planar surface of the base, two planar layers of the two components of a binary eutectic system overlying the dielectric and insulating layer and an optional cover layer overlying the eutectic components.

Reference is made to FIG. 1 wherein there is shown substrate 20 suitable for the manufacture of charge-coupled devices. In simplest yet functional form, substrate 20 includes at least planar base 22 and planar layer 24 which overlies and is contiguous with at least a portion of either of major planar surfaces 26 or 28 of base 22. Peripheral edge area 30, which interconnects surfaces 26 and 28, may be of any convenient shape.

The material of base 22 is a semiconductor, such as silicon, which is generally provided with excess atoms of an impurity (i.e., a dopant) to impart p-type or n-type conductivity to the semiconductor material. Layer 24 is of a dielectric and insulating material which is deposited or otherwise provided. The presently preferred mode for providing layer 24 is to thermally grow an oxide of the semiconductor material of base 22, e.g., silicon dioxide on silicon, by techniques familiar to those practicing the semiconductor device manufacturing arts. While substrate 20 has been described in its simplest yet functional form, it is not intended that the invention be limited by the above description as the invention is functional with other substrates, such as non-homogeneously doped substrates, compatible with the charge-coupled device concept.

In the practice of the present invention, a eutectic alloy is next solidified as a thin film on planar layer 24 as described below in brief, but functional, detail and in greater detail in the above cross-referenced and incorporated Ser. No. 245,764 application and the paper "Directionally Solidified Thin-Film Eutectic Alloys" by H. E. Cline (Journal of Applied Physics, 52 (1), pp. 256-260, January 1981) which is also incorporated herein by reference. The eutectic alloy selected is one which can be solidified to form a lamellar structure, i.e., one having alternating plate-like regions whose compositions correspond substantially to the phases of the eutectic system. Although the present invention is not limited to the use of binary eutectic systems, typical suitable binary metallic systems include, for example, the lead-tin, lead-cadmium and aluminum-copper systems. Where subsequent device processing steps include processing at high temperatures, the refractory metal-based metallic eutectic systems such as the chrome-silicon and molybdenum-silicon systems are useable and desirable.

The thicknesses of the materials, i.e., components, of the eutectic alloy system are calculated per unit area of surface 32 of layer 24 as a ratio according to the following formula:

$$t_1 \rho_1 W_1 = t_2 \rho_2 W_2 = \ldots = t_n \rho_n W_n \tag{1}$$

where
$W_1$ = weight percent of component 1 in the eutectic
$W_n$ = weight percent of the $n^{th}$ component in the eutectic
$\rho_1$ = density of component 1
$\rho_n$ = density of the $n^{th}$ component
$t_1$ = thickness of the layer of component 1
$t_n$ = thickness of the layer of the $n^{th}$ component and converted to actual thicknesses by use of the formula:

$$t_{film} = t_{total} = t_1 + t_2 + \ldots + t_n \tag{2}$$

For a binary system, equation (1) reduces to $$\frac{t_1}{t_2} = \frac{\rho_2 W_1}{\rho_1 (1 - W_1)} \tag{3}$$

The calculational method shown above is more accurate than calculations from the phase diagram based on the so-called lever rule and is, therefore, preferred.

The starting materials should be as pure as possible, preferably "4-9s" or purer, as impurities tend to disrupt the heat and mass balance of the solidifying eutectic during the subsequent processing described below thereby forming defects, e.g., faults. Contamination of substrate 20 and the materials of the eutectic is to be avoided, thus the practice of clean room conditions, such as are known to those skilled in the art of the manufacture of semiconductor devices, is preferable.

The eutectic materials and substrate 20 are transferred to suitable apparatus (not shown) for the evaporation and deposition of the eutectic materials onto substrate 20. In a vacuum, preferably less than or equal to $10^{-6}$ torr, the materials of the eutectic are evaporated and deposited sequentially in overlying planar layer-like fashion onto substrate 20. In FIG. 1 there is shown schematically layer 34 of a first component of a binary eutectic system deposited upon surface 32 of substrate layer 24 and layer 36 of the second component deposited upon layer 34. Preferably, the thickness of each layer is within ±10% of that calculated with Equations (1) and (2), although for some eutectic systems the acceptable tolerance may be less than ±10%.

Optionally, cover layer 38, as shown in FIG. 1, may be provided on top of the deposited eutectic components. Cover layer 38 may be provided by depositing a refractory metal oxide subsequent to the deposition of the layers of the eutectic material or may be another piece of the same material as substrate base 22 laid upon the deposited components. Cover layer 38 is desirable to prevent oxidation of the eutectic during subsequent processing. Oxidation may also be avoided by practicing the invention in a vacuum or inert atmosphere. With or without cover layer 38, a completed preform 40 has been fabricated at this stage.

Figure 2:
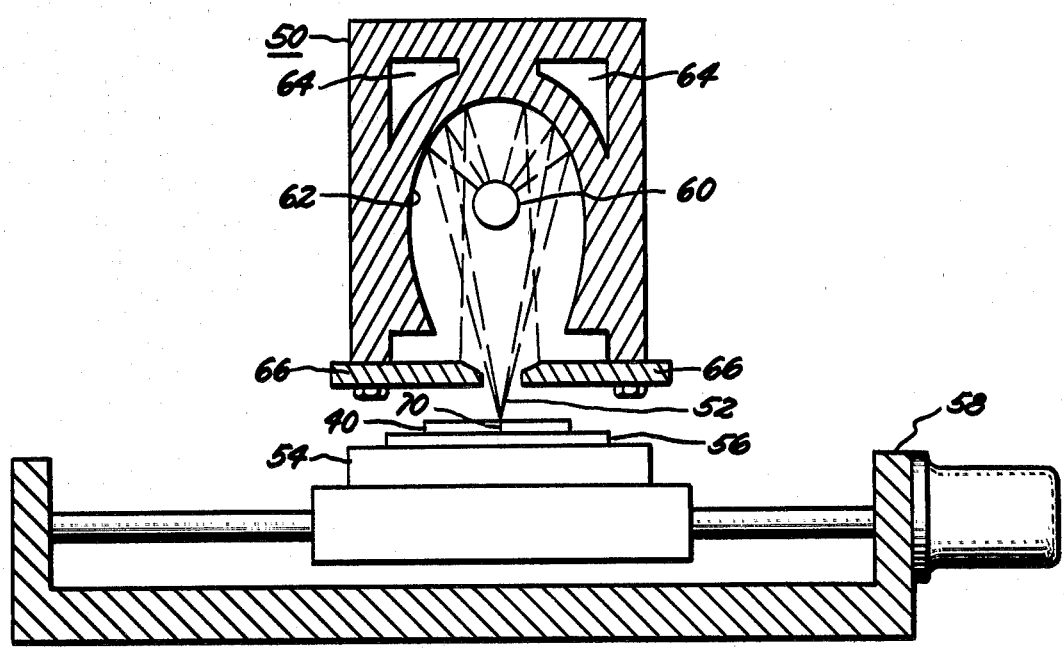
FIG. 2 is a schematic representation in cross-section of an apparatus, including a line heater, used to form a thin film eutectic on the substrate of FIG. 1.

The prepared eutectic preform 40 is next placed in an apparatus, such as that shown schematically in FIG. 2, for the next steps in the preparation of the eutectic thin film. Typically, the apparatus of FIG. 2 consists of heat source 50 capable of projecting a beam of heat 52 onto preform 40, heat sink 54, which may be water cooled, optional thermal buffer plate 56 of a material such as quartz, and means 58 for smoothly translating heat sink 54 and preform 40 mounted thereon beneath beam 52 at a determinable rate. Sufficient heat is applied from heat source 50 to form narrow molten zone 70 of width W and longitudinal length L, as shown in FIG. 3.

A line heater, such as that shown in FIG. 2, has been found to be an effective heat source 50 with suitable modifications including a line voltage regulator to minimize power fluctuations. One such line heater is that manufactured by Research, Inc. of Minneapolis, Minn. (Catalogue #5215-10). The line heater of FIG. 2 consists primarily of lamp 60, such as a quartz-iodine or arc lamp, situate at the focal point of a polished aluminum elliptical reflector 62 which has cooling channels 64 therein. The commercial line heater was further modified by shutters 66 of highly polished aluminum which effectively intensify the thermal profile of beam 52 thus narrowing the width of zone 70 thereby increasing the thermal gradient in zone 70.

A laser is also a suitable, although more expensive, heat source 50 than the line heater. The narrower molten zone 70 created by a laser makes possible both higher thermal gradients and more rapid solidification rates in molten zone 70 and, consequently, eutectic thin films having narrower lamellae and smaller interlamellar spacings. Replacement of the line heater with a laser as heat source 50 requires means for spreading the circular beam into a linear (line) heat source. The use of optics to slowly scan or raster the laser beam across preform 40 has been found to result in objectionable surface perturbations. A simple non-mechanical solution is to provide a cylindrical lens in the path of the laser beam between the laser as heat source 50 and preform 40 to convert the circular beam into a thin line source of heat. It was found, however, that the beam intensity was not uniform along the length of the line when the lens system was used, i.e., there was a decrease in power at the ends compared to the center of the line of heat.

The laser beam may be scanned rapidly enough through the use of a lens-mirror system, such as a rotating polygonal mirror, to create a satisfactory line source of heat. A further advantage of the use of a laser as heat source 50 is that preform 40 may be kept stationary and molten zone 70 traversed across preform 40 by the use of additional optical scanning means. By keeping preform 40 stationary, it is possible to minimize disruption of the eutectic structure by external mechanical vibrations. The use of the rotating polygonal mirror, however, adds to the overall cost of the system and requires that the optical system be kept in perfect alignment.

As shown in FIG. 4, molten zone 70 will be coextensive with and will rest on at least a portion of surface 32 of layer 24 and will otherwise be bounded by the unmelted eutectic material layers 34 and 36 and solidified thin film eutectic 72. By operating means 58, preform 40 is traversed beneath the stationary heat source thereby, in effect, moving molten zone 70 across preform 40. As molten zone 70 traverses preform 40, component layers 34 and 36 of the eutectic are melted at leading edge 74 of zone 70, mixed together in zone 70, and solidified at trailing edge 76 of zone 70 in the desired eutectic pattern 72. After the desired amount of material has been melted and solidified, the traversing motion of means 58 is stopped and heat source 50 is turned off whereupon molten zone 70 freezes in situ. In FIG. 3, molten zone 70 is shown after traversing a distance Z, in the direction of arrow 78 from starting location 80.

Figure 5:
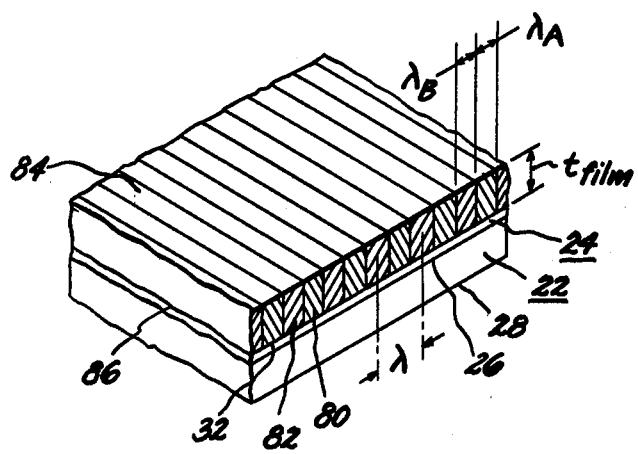
FIG. 5 is a schematic dimensional view in partial cross-section of a thin film lamellar eutectic situated on a substrate.

FIG. 5 is a schematic cross-sectional representation of the structure of solidified eutectic 72 and is typical of the two phase thin film lamellar metallic eutectics made by the method described above. The interlamellar spacing, $\lambda$, defined as the distance between the center of one lamella to the center of the nearest adjacent lamella of the same type, i.e., metallic phase, is shown in FIG. 5 as are the widths $\lambda_A$ and $\lambda_B$ of lamella 80 and 82, respectively, and the resultant film thickness, $t_{film}$. Generally, the thickness of the resultant film, $t_{film}$, is equal to the sum of the thicknesses of the component layers. The lamellae extend between and terminate in the substantially parallel and generally planar top 84 and bottom 86 surfaces of the thin film. The center lines of the lamellae are substantially parallel to the film thickness dimension, i.e., the lamellae intersect top 84 and bottom 86 surfaces of the thin film at substantially right angles. The interlamellar spacing, $\lambda$, and, consequently, the widths of the lamellae are principally a function of the growth, i.e., solidification, rate which generally follows the empirical relationship $$\lambda^2 V = \text{constant} \qquad (4)$$

where V equals the growth rate. Generally, the growth rate is equal to the rate at which molten zone 70 is traversed across preform 40.

Figure 6:
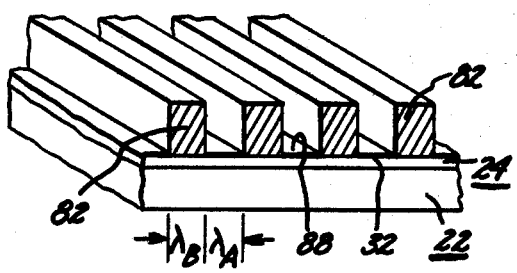
FIG. 6 is a schematic dimensional representation of the structure of FIG. 5 following selective removal of one of the phases to form a first array of spaced metallic gates of the remaining phase.

Next, in accordance with the teachings of the above cross-referenced Ser. No. 320,995 application, one of the phases of the solidified thin film eutectic is selectively removed. Suitable means include chemical dissolution and reactive ion etching (plasma etching). As shown in FIG. 6, the product of this step is an array of spaced substantially parallel metallic wires 82 with exposed areas 88 of surface 32 of planar layer 24 therebetween. Wires 82 constitute a first array of gates for the charge-coupled devices produced by the method of this invention. A particularly desirable feature of wires 82 is their micron and submicron width ($\lambda_B$) and spacing ($\lambda_A$).

Figure 7:
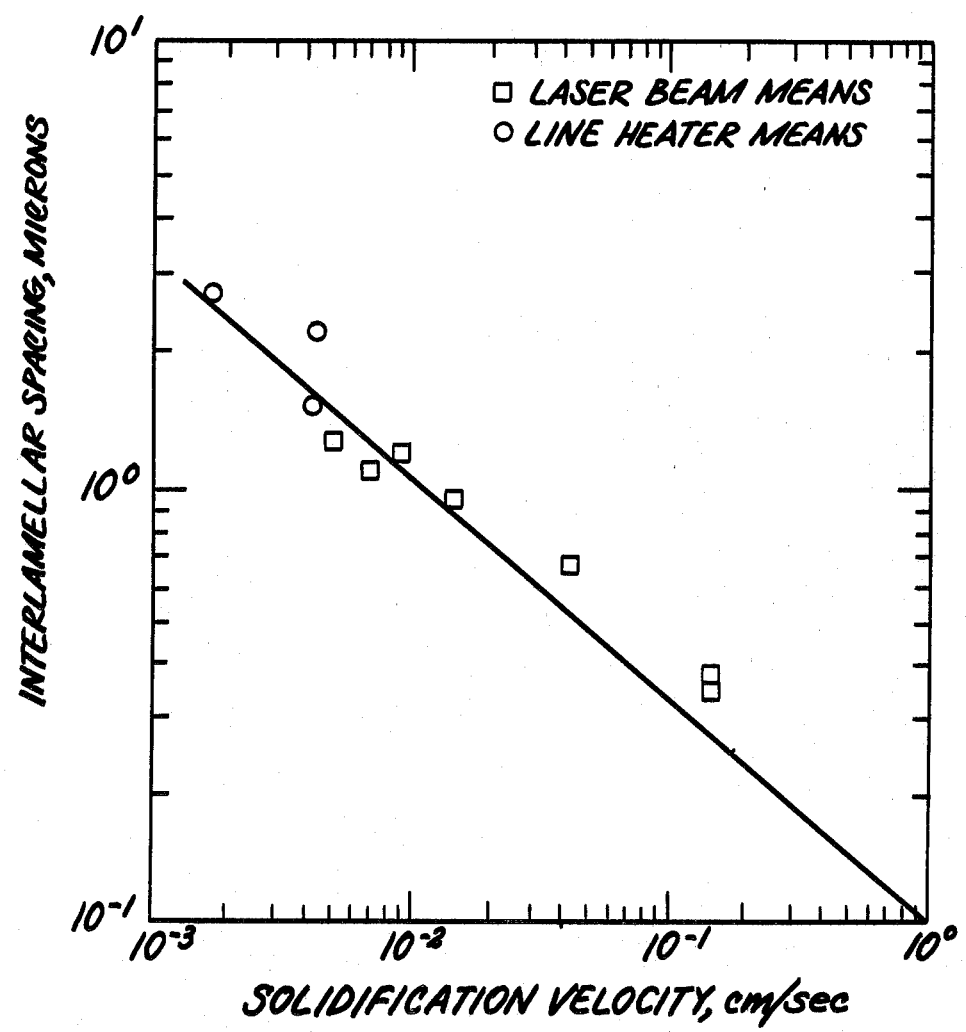
FIG. 7 is a graph of the interlamellar spacing of thin films of the Al-$CuAl_2$ eutectic system as a function of solidification velocity.

FIG. 7 shows data of interlamellar spacing as a function of the solidification velocity for several preforms of the Al-CuAl$_2$ eutectic alloy system (33.2 wt.% Cu) solidified on a Pyrex ® substrate using line heater and laser beam means. The preforms were made by depositing layers of Cu and Al on the Pyrex ® substrate with an electron beam evaporator in a vacuum of $10^{-6}$ Torr at a rate of 20 Angstroms/sec. During evaporation, the thicknesses of the layers were monitored to give a 2580 Å thick copper layer and a 17420 Å thick aluminum layer. These thicknesses were calculated by equation (3) to give a 2 micron thick thin film of the eutectic composition.

The CuAl$_2$ phase ($\theta$) was selectively removed by electropolishing the films in a Disa Electropol Type 53 apparatus in a flowing solution of 62 ml perchloric acid, 137 ml water, 700 ml ethanol, and 100 ml butycellosolve. The electropolishing process was conducted at 35 volts direct current (DC) for 4 seconds at room temperature with the thin film as the anode and a stainless steel cathode of approximately the same surface area as the film situated opposite the thin film and separated by about 10 mm from the film.

The widths of the remaining wires of the aluminum-rich phase ($\alpha$) and spacing between the remaining lamellae were measured in a scanning electron microscope. Since the width of the α-phase was essentially equal to the width of the of the θ phase, the remaining α-phase wires were one-half of the interlamellar spacing plotted on FIG. 7. Thus, for the preform solidified at 0.0016 cm/sec having an interlamellar spacing of about 2.4 microns the width of the remaining wires of the α-phase was about 1.2 microns. For the preform solidified at 0.14 cm/sec having an interlamellar spacing of about 0.33 micron the width of the remaining wires of the α-phase was about 0.16 micron. In all cases, the height of the remaining wires was about 2 microns above surface 32. The data of FIG. 6 are described by the equation $$\lambda = B(V)^{-\frac{1}{2}} \quad (5)$$

where the constant $B = 8.4 \times 10^{-6}$ cm$^{3/2}$sec$^{-\frac{1}{2}}$. The scatter in the interlamellar spacing is attributed to local fluctuations in the solidification velocity or in the constancy of the heat flow.

Transmission electron microscopy of the as-solidified eutectic thin films demonstrated that the interphase boundary between the Al-rich (α) phase and the CuAl$_2$ (θ) phase was planar and oriented normal to the plane of the film. Selective area electron diffraction was used to identify the phases and showed that the fine wires were single crystals. Single crystals are advantageous for use as gates at submicron dimensions since single crystals exhibit minimal electromigration and improved thermal stability compared to polycrystals at the high temperatures which may be encountered in subsequent processing operations.

Using the same general procedure and equipment described above, a 5320 Å thick layer of cadmium and a 15,680 Å thick layer of lead were sequentially deposited on a Pyrex ® substrate in a vacuum of $10^{-6}$ Torr and directionally solidified at 0.0042 cm/sec.

The resultant lead-cadmium eutectic (17.4 wt.% Cd) thin film was electropolished using the pump from the Disa apparatus to pump a solution of 1% perchloric acid in methanol through a hypodermic syringe. The needle of the syringe, as the cathode, was traversed back and forth across a selected area of the anodic thin film at a distance of about 4 cm at a direct current potential of about 150 volts between the two. The structure was observed periodically through a microscope and the electropolishing was continued until the lamellae of the cadmium-rich phase were removed from between the lamellae of the lead-rich phase in the selected area. The result was a spaced array of lead-rich wires about 0.42 micron wide having an interlamellar spacing of about 0.57 micron. Alternatively, it has been found that dissolution of the cadmium-rich wires can be accomplished by simple immersion in a 1% solution of Nital (1 ml HNO$_3$ in 99 ml ethyl alcohol).

The next step in the method of the instant invention is to apply a layer of an insulating material over at least the exposed surfaces of metallic wires or gates 82 of the first array. In one common version of CCDs, only the exposed surfaces of gates 82 are insulated while exposed areas 88 of surface 32 of planar layer 24 between wires 82 are maintained substantially free of the insulating material. In another version, the insulating material is applied as a continuous layer over the exposed surfaces of spaced metallic gates 82 of the first array, into the spaces between spaced metallic gates 82 and onto exposed surfaces 88 of surface 32 of planar layer 24.

In the former case, this step is preferably accomplished by anodic oxidation of wires 82. Alternatively, as shown in FIGS. 8A and 8B, this step may also be accomplished by alternately depositing insulating material 90 at opposed oblique angles β and β' to vertical 94 to the planar surface of substrate 20. By properly selecting β and β' as a function of the height of wires 82 above surface 32 of layer 24, it is possible to preclude or minimize deposition of insulating material 90 onto exposed surface areas 88. This oblique deposition process may be done by the electron beam deposition of such materials as SiO$_2$ or Al$_2$O$_3$. The end result is shown in FIG. 8B to be a first array of spaced insulated metallic gates 82.

As noted above, in some cases it may be desirable for insulating layer 92 to also be deposited on exposed areas 88 between wires 82 as shown in FIG. 8C. This may be accomplished by such means as chemical vapor deposition (CVD), sputtering or by electron beam depositing insulating material 90 while sweeping the beam through the angle from β to the vertical and then to 62 '.

Next, a substantially continuous layer of a conducting material such as copper, chromium or molybdenum is deposited over the spaced insulated metallic gates of the first array and into the spaces between the spaced insulated metallic gates.

In the case of the structure of FIG. 8B, the conducting material is deposited as substantially continuous layer 96 over spaced insulated metallic gates 82 of the first array, into the spaces between spaced insulated gates 82 and onto exposed areas 88 of surface 32 of planar layer 24 between spaced insulated metallic gates 82 to form the representative structure of FIG. 9. In the case of the structure of FIG. 8C, the conducting material is deposited as a substantially continuous layer over previously applied continuous layer 92 of insulating material. Suitable means for depositing layer 96 include sputtering and electron beam deposition.

Lastly, segments of layer 96 are preferentially removed to form a second array of spaced metallic gates 96 substantially juxtaposed, i.e., in a substantially side-by-side relationship, from metallic gates 82 of the first array. This last step is preferably accomplished by plasma etching or by electropolishing means, thus obviating the need to use any masking or alignment procedures during the course of the practice of the method of the instant invention.

While the invention has been particularly shown and described with reference to several preferred embodiments thereof, it will be understood by those skilled in the art that various changes in form and detail may be made therein without departing from the true spirit and scope of the invention as defined by the appended claims.

What is claimed is:

1. A method for making charge-coupled semiconductor devices comprising the steps of:
   (a) providing a substrate suitable for the manufacture of charge-coupled devices;
   (b) forming a thin film two phase lamellar metallic eutectic on said substrate from elements of at least 0.9999 purity;
   (c) selectively removing one of the phases of said thin film lamellar metallic eutectic forming thereby a first array of spaced metallic gates of the remaining phase;

(d) applying a layer of an insulating material over at least the exposed surfaces of said spaced metallic gates of said first array;

(e) depositing a substantially continuous layer of a conducting material over the spaced insulated metallic gates of said first array and into the spaces between said spaced insulated metallic gates; and (f) preferentially removing segments of said continuous layer of a conducting material to form a second array of spaced metallic gates substantially juxtaposed from said metallic gates of said first array.

2. The method of claim 1 wherein said substrate comprises at least a planar base of a semiconductor material and a planar layer of a dielectric and insulating material situated on and contiguous with at least a portion of a planar surface of said planar base, said planar layer providing the surface on which the thin film lamellar eutectic is to be formed.

3. The method of claim 2 wherein the semiconducting material of said planar base is silicon and said planar layer of a dielectric and insulating material is silicon dioxide.

4. The method of claim 1 wherein said lamellar metallic eutectic is one selected from the group consisting of the lead-tin, lead-cadmium, aluminum-copper, chrome-silicon and molybdenum-silicon eutectic systems.

5. The method of claim 1 wherein the width of each said metallic gate of said first array and the spaces between said spaced metallic gates are less than or equal to about 1 micron.

6. A method of making charge-coupled semiconductor devices comprising the steps of:

(a) providing a substrate suitable for the manufacture of charge-coupled devices, said substrate including at least a planar base of a semiconductor material and a planar layer of a dielectric and insulating material situated on and contiguous with at least a portion of a planar surface of said base;

(b) forming a thin film two phase lamellar metallic eutectic on said planar layer of a dielectric and insulating material from elements of at least 0.9999 purity;

(c) selectively removing one of the phases of said thin film lamellar metallic eutectic forming thereby a first array of spaced metallic gates of the remaining phase and exposing thereby the surface of said planar layer of a dielectric and insulating material beneath the selectively removed phase and between said spaced metallic gates of said first array;

(d) applying a layer of an insulating material over the exposed surfaces of said spaced metallic gates of the remaining phase while maintaining the surface of said planar layer of a dielectric and insulating material between said spaced metallic gates of said first array substantially free of said insulating material;

(e) depositing a substantially continuous layer of a conducting material over the spaced insulated metallic gates of said first array, into the spaces between said spaced insulated metallic gates and onto the surface of said planar layer of a dielectric and insulating material between said spaced insulated metallic gates of said first array; and (f) preferentially removing segments of said continuous layer of a conducting material to form a second array of spaced metallic gates substantially juxtaposed from said metallic gates of said first array.

7. The method of claim 6 wherein the semiconducting material of said planar base is silicon and said planar layer of a dielectric and insulating material is silicon dioxide.

8. The method of claim 6 wherein said step of applying a layer of an insulating material over the surfaces of said spaced metallic gates is accomplished by oblique deposition.

9. The method of claim 6 wherein said step of applying a layer of an insulating material over the surfaces of said spaced metallic gates is accomplished by anodic oxidation.

10. The method of claim 6 wherein said lamellar metallic eutectic is one selected from the group consisting of the lead-tin, lead-cadmium, aluminum-copper, chrome-silicon and molybdenum-silicon eutectic systems.

11. The method of claim 6 wherein the width of each said metallic gate of said first array and the spaces between said spaced metallic gates are less than or equal to about 1 micron.

12. A method for making charge-coupled semiconductor devices comprising the steps of:

(a) providing a substrate suitable for the manufacture of charge-coupled devices, said substrate including at least a planar base of a semiconducting material and a planar layer of a dielectric and insulating material situated on and contiguous with at least a portion of a planar surface of said base;

(b) forming a thin film two phase lamellar metallic eutectic on said planar layer of a dielectric and insulating material from elements of at least 0.9999 purity;

(c) selectively removing one of the phases of said thin film lamellar metallic eutectic forming thereby a first array of spaced metallic gates of the remaining phase and exposing thereby the surface of said planar layer of a dielectric and insulating material beneath the selectively removed phase and between said spaced metallic gates of said first array;

(d) applying a continuous layer of an insulating material over the exposed surfaces of said spaced metallic gates of the remaining phase, into the spaces between said spaced metallic gates and onto the surface of said planar layer of a dielectric and insulating material between said spaced metallic gates of said first array;

(e) depositing a substantially continuous layer of a conducting material over said continuous layer of an insulating material; and (f) preferentially removing segments of said continuous layer of a conducting material to form a second array of spaced metallic gates substantially juxtaposed from said metallic gates of said first array.

13. The method of claim 12 wherein the semiconducting material of said planar base is silicon and said planar layer of a dielectric and insulating material is silicon dioxide.

14. The method of claim 12 wherein said lamellar metallic eutectic is one selected from the group consisting of the lead-tin, lead-cadmium, aluminum-copper, chrome-silicon and molybdenum-silicon eutectic systems.

15. The method of claim 12 wherein the width of each said metallic gate of said first array and the spaces between said spaced metallic gates are less than or equal to about 1 micron.

* * * * *